United States Patent
Joist et al.

(10) Patent No.: US 6,865,092 B2
(45) Date of Patent: Mar. 8, 2005

(54) FRONT PART FOR ELECTRONIC PLUG-IN MODULES

(75) Inventors: Michael Joist, Gaggenau (DE); Klaus-Michael Thalau, Malsch (DE); Hans-Jorg Weiler, Ettlingen (DE)

(73) Assignee: Schroff GmbH, Straubenhardt (DE)

( * ) Notice: Subject to any disclaimer, the term of this patent is extended or adjusted under 35 U.S.C. 154(b) by 0 days.

(21) Appl. No.: 10/210,529

(22) Filed: Aug. 1, 2002

(65) Prior Publication Data

US 2003/0039104 A1 Feb. 27, 2003

(30) Foreign Application Priority Data

Aug. 1, 2001 (DE) .......................................... 101 37 746

(51) Int. Cl.⁷ ................................................. H05K 9/00
(52) U.S. Cl. ...................... 361/818; 361/816; 361/800; 174/35 R; 174/35 GC
(58) Field of Search ................................ 361/752, 796, 361/800, 816, 818, 753; 174/35 R, 35 GC, 35 MS; 211/41.17

(56) References Cited

U.S. PATENT DOCUMENTS

| | | | | |
|---|---|---|---|---|
| 5,083,239 A | * | 1/1992 | Sedlemeier et al. | ........ 361/816 |
| 5,233,507 A | * | 8/1993 | Gunther et al. | ............. 361/818 |
| 5,796,594 A | * | 8/1998 | Kabat et al. | ................. 361/818 |
| 5,853,296 A | | 12/1998 | Gunther et al. | ................ 439/92 |
| 5,863,016 A | * | 1/1999 | Makwinski et al. | ........ 248/27.1 |
| 5,934,915 A | * | 8/1999 | Henningsson et al. | ......... 439/92 |
| 5,943,219 A | * | 8/1999 | Bellino et al. | ............... 361/816 |
| 6,281,433 B1 | * | 8/2001 | Decker et al. | ............ 174/35 R |
| 6,320,120 B1 | * | 11/2001 | Van Haaster | ........... 174/35 GC |
| 6,390,320 B2 | * | 5/2002 | Hurst et al. | .................. 220/241 |
| 6,483,024 B1 | * | 11/2002 | Smithson et al. | ....... 174/35 GC |

FOREIGN PATENT DOCUMENTS

| | | | | |
|---|---|---|---|---|
| DE | 3604860 | | 6/1994 | ......... H05K/009/00 |
| DE | 19544835 | | 10/1996 | ......... H05K/009/00 |
| DE | 19611719 | | 10/1997 | ......... H05K/009/00 |

* cited by examiner

Primary Examiner—David Martin
Assistant Examiner—Dameon E. Levi
(74) Attorney, Agent, or Firm—Schwegman, Lundberg, Woessner & Kluth, P.A.

(57) ABSTRACT

A front part (3) for electro-magnetically screened-off modules (2) that are inserted into module chassis', the front part has a front panel (5) that has a longitudinal groove (7a, 7b) on each of its two narrow edges (6a, 6b). Two mounted side parts (8a, 8b) that have a L-shaped profile are arranged in such a way that the one L-leg (9a, 9b) reaches into one of the longitudinal grooves (7a, 7b) of the front panel (5), and the other L-leg (10a, 10b) can be designed as sealing body for the acceptance of a HF-seal or as contact surface (12).

9 Claims, 1 Drawing Sheet

FRONT PART FOR ELECTRONIC PLUG-IN MODULES

RELATED APPLICATION

This application claims priority under 35 U.S.C. 119 from German Application No. 101 37 746.0, filed Aug. 1, 2001, which application is incorporated herein by reference.

FIELD OF THE INVENTION

The invention concerns a front part for electromagnetically screened-off modules that are inserted into a module chassis.

BACKGROUND OF THE INVENTION

Front parts for modules are used for the sealing and closing of modules chassis for electronic devices to achieve the electromagnetic decoupling of the module chassis from its environment. During that, the electronic module within the module chassis has to be protected against external electromagnetic interferences and on the other hand, the emissions of the modules have to be minimized so that only a minor disturbance of the environment is generated by the electronic. Therefore, a high shielding effect of the module chassis against high frequency electromagnetic alternating fields is necessary.

The weak points of the electromagnetic shielding are the vertical slots, occurring between two adjacent front parts, respectively between front part and chassis.

The width of the slots heavily depends on the tolerances of the front panels that are inserted into the module chassis. Flexible contact materials, which should cause a HF-tight electrical bonding of the opposite edges of two adjacent front panels, are therefore inserted between the front panels.

Front panels for plug-in modules that have a groove on the side in its narrow edges in which spring elements are mounted are known from the patent letter DE 195 44 835 C1. The spring elements point in the plug-in direction and exceed the thickness of the front panel. Such contact springs can easily be damaged by the user during the removal or insertion. Furthermore, they have the disadvantage that the contact springs have no lateral guide and can therefore only sustain limited lateral pressure.

A contact arrangement is known from DE 196 11 719 A1 for the manufacturing of an HF-tightness between two front panels, adjoining at their front sides. There, different sealing elements and contact springs are proposed. Because of the standard default for the thickness of the front panels only very small tightness elements can be inserted, which can only insufficiently fill the slots between adjacent modules. The proposed contact springs bypass this problem. Since they exceed the thickness of the front panel in the direction of insertion, the contact springs can easily be damaged by the user when handled during insertion and removal.

One-piece, in cross-section U shaped front panels, are known from the disclosure statement DE 36 04 860 A1, which two side parts point in the plug-in direction and one side part is designed as contact strip and the other as glide spring strip for the acceptance of spring elements.

One-piece, in cross-section U-shaped front panels are usually manufactured from aluminum by extrusion. During this process, the material is subject to severe change in temperature, which results in shrinking and unexpected change in dimension. Subsequent pulling (straightening) also affects the production dimension. Therefore, the desired width of the front panels can only be achieved with large tolerances. The larger the front panel is, the larger the measuring tolerances will get. For very wide front panels the normative predefined tolerances cannot be maintained at all. For the production of one-piece front panels that are different in width a separate tool must be used for each width. This procedure requires a big and especially cost-intensive effort.

As a further disadvantage, the surface structure and the configuration structure of the material is altered during the extrusion. The effects especially appear with wide and at the same time thin-walled front panels. The front panels cannot be eloxadized in a uniform way. That leads to consuming and expensive post-production. No sophisticated, eloxadized front panels can be manufactured without post-production.

SUMMARY OF THE INVENTION

The task of the invention is the creation of a front part for an HF-tightened module chassis that has minor measuring tolerances, which front area can be eloxadized without problems, and which is manufactured in different widths with the same tools.

To solve this task it is necessary to proceed from a flat front panel that carries a groove on two narrow edges. According to one embodiment of the invention, the task is solved in such a way, that each horizontal groove of the two narrow edges of the front panel is engaged by one leg of a side part (L-shaped in cross section), while the second leg points in the plug-in direction. This results in a front part that is U-shaped in cross section.

The front part according to the invention can be manufactured in any width in a sophisticated, eloxadizable quality. The flat front panels can cut true to size in an easy way, so that the tolerances required by the standard can be met without expansive post-production. A single tool for the front panel can be used for the manufacturing of front parts that are different in width, since the form of the side part is independent from the width of the front panel. Special tools are only needed for the outlined side parts, but those have relatively small dimensions. During the mounting, the side parts reaching into the longitudinal grooves of the front panel can still be adjusted in direction of the plug-in, so that possible tolerances of the front panel and/or the side parts can be leveled out.

The free L-legs that are pointing in the plug-in direction offer a large surface, which is necessary to guarantee a low-impedance and low-inductive contact between two adjacent front parts. For practical purposes the longitudinal grooves in the narrow edges of the front panels show an essentially right-angled profile. Such a profile can relatively easy be produced by milling or sawing.

Preferably, a recess is inserted in the L-leg of the side parts that reach into the longitudinal grooves. That way, the connection between the front panel and the side part can be improved. The recess in the L-leg is especially advantageous, if a form termination is created between the front panel and the side part by caulking with a tool.

To create a lasting connection between the front panel and a side part, the L-leg reaching in the longitudinal groove can be glued with the front panel.

To prevent that the L-leg of a side part slips out of the longitudinal groove of the front panel the L-leg reaching into the longitudinal groove can be pressed into it in an advantageous way, so that a stiff connection is caused between the front panel and the L-leg.

In one embodiment, the L-leg of a side part pointing in plug-in direction is designed as sealing body. The sealing body allows the acceptance of elastic conductive seals or small conductive contact springs. With that, an electrical HF-contact is created between two adjacent front parts or between a front part and the wall of the module chassis. The L-leg pointing in plug-in direction can also be designed as an essentially flat contact surface.

Especially advantageous is a front part whose side part has an L-leg pointing in the plug-in direction that is designed as contact surface and whose second side part has an L-leg pointing in the plug-in direction that is designed as sealing body.

BRIEF DESCRIPTION OF THE DRAWINGS

An example of a version of the invention is explained in more detail below with the help of the attached drawings. They show.

Figure 1:
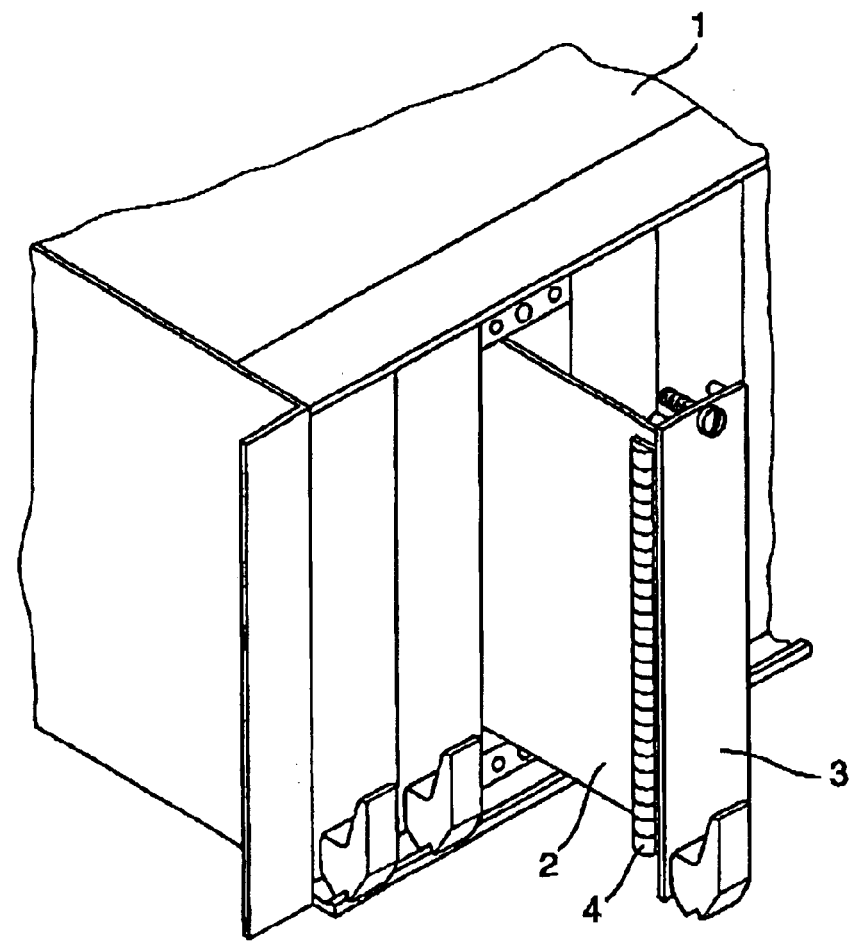
FIG. 1 shows a module chassis with several modules.

SUMMARY OF THE REFERENCE NUMBERS 1 module chassis
2 module
3 front part
4 contact spring strip
5 front panel
6a, 6b narrow edges
7a, 7b longitudinal groove
8a, 8b side parts
9a, 9b L-legs
10a, 10b L-legs
11 void
12 contact surface
13a, 13b recess

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the scope of the present invention. Therefore, the following detailed description is not to be taken in a limiting sense, and the scope of the present invention is defined by the appended claims and their equivalents.

FIG. 1 shows a module chassis 1 with several, next to each other arranged modules, in which one of the modules is partially pulled out from the module chassis 1. The module 2 shows a front part 3 on whose left side a HF-seal in form of a contact spring 4 is intended.

Figure 2:
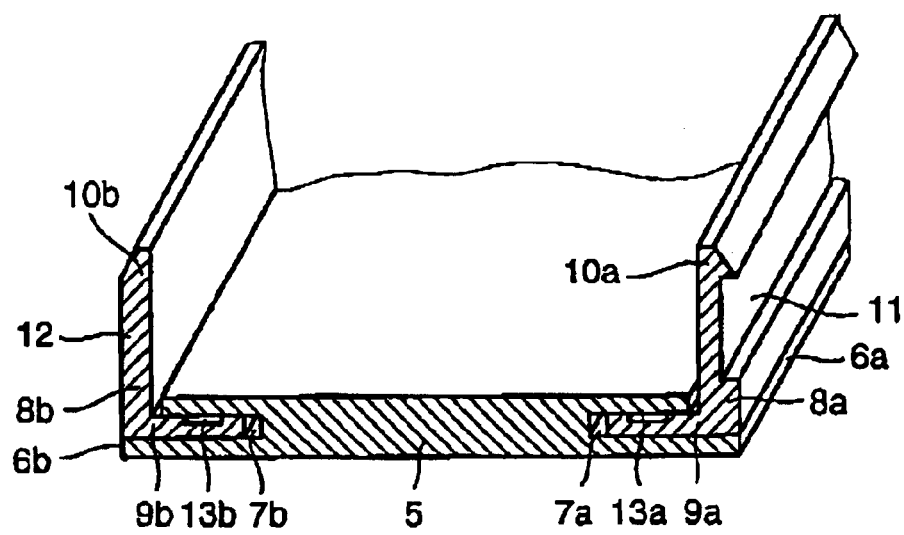
FIG. 2 shows a cross section through the front part of a module chassis according to FIG. 1.

FIG. 2 shows the front part 3 of the module 2 from FIG. 1 in cross section.

A flat front panel 5 has a longitudinal groove 7a, 7b on both of its narrow edges 6a, 6b. The longitudinal grooves 7a, 7b both have a right-angled profile.

Right and left of the front panel 5 are two side parts 8a, 8b attached, which have an essentially L-shaped cross section. The on L-legs 9a, 9b of the side parts 8a, 8b reach into the longitudinal grooves 7a, 7b. The other L-legs 10a, 10b of the side parts 8a, 8b each point in the plug-in direction (compare FIG. 1).

The leg 10a of the right side part 8a, pointing in the plug-in direction, is designed as sealing body. Conductive sealing elements or contact springs can be held in a void 11, for example the contact spring strip 4 of FIG. 1.

The leg 10b of the left side part 8b, pointing in the plug-in direction, is designed as contact surface 12. It represents an attachment area for a sealing element or a contact spring of an adjacent front part 3.

The L-legs 9a, 9b of the side parts 8a, 8b that are reaching into the longitudinal grooves 7a, 7b each show a recess 13a, 13b.

The two side parts 8a, 8b with their L-legs 9a, 9b are so far inserted into the respective longitudinal grooves 7a, 7b that the two side parts 8a, 8b are essentially flush with the front panel 5.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A front part for an electro-magnetically screened-off module that is inserted into a module chassis, the front part comprising:
    a flat front panel having two narrow edges, and having a longitudinal groove exposed on an outer surface and extending along an entire length of each of the two narrow edges; and
    first and second side parts that are substantially L-shaped in cross section, each of the first and second side parts having a first L-leg which is mounted within one of the longitudinal grooves of the flat front panel and a second L-leg which points in a plug-in direction of the module.

2. The front part of claim 1, wherein each of the longitudinal grooves have a right-angled profile.

3. The front part of claim 1, wherein each of the first L-legs of each of the first and second side parts includes a recess.

4. The front part of claim 1, wherein the front plate and each of the first L-legs are connected flush.

5. The front part of claim 1, wherein each of the first L-legs is glued together with the front panel.

6. The front part of claim 1, wherein each of the first L-legs is pressed into the respective longitudinal grooves of the front panel.

7. The front part of claim 1, wherein each of the second L-legs which is pointing in the plug-in direction is designed as sealing body for the acceptance of a sealing element or a contact spring.

8. The front part of claim 1, wherein each of the second L-legs which is pointing in the plug-in direction is designed as an essentially flat contact surface for a sealing element or a contact spring.

9. The front part of claim 1, wherein an outer part of the front panel is flush with the second L-legs that are pointing in the plug-in direction.

* * * * *